United States Patent

Katsumata

[11] Patent Number: 5,723,901
[45] Date of Patent: Mar. 3, 1998

[54] STACKED SEMICONDUCTOR DEVICE HAVING PERIPHERAL THROUGH HOLES

[75] Inventor: Akio Katsumata, Kanagawa-ken, Japan

[73] Assignee: Kabushiki Kaisha Toshiba, Kawasaki, Japan

[21] Appl. No.: 570,695

[22] Filed: Dec. 11, 1995

[30] Foreign Application Priority Data

Dec. 13, 1994 [JP] Japan .................................. 6-308963

[51] Int. Cl.$^6$ .......................... H01L 23/02; H01L 23/48; H01L 23/52; H01L 29/40
[52] U.S. Cl. .......................... 257/686; 257/685; 257/777; 257/700; 257/774; 257/693; 257/723
[58] Field of Search ............ 257/686, 5, 700–702, 257/774, 777, 678, 687, 693, 723, 729, 730

[56] References Cited

U.S. PATENT DOCUMENTS

| | | | |
|---|---|---|---|
| 4,224,637 | 9/1980 | Hargis | 257/686 |
| 4,956,694 | 9/1990 | Eide | 257/686 |
| 5,172,033 | 12/1992 | Bernardoni et al. | 257/686 |
| 5,334,857 | 8/1994 | Mennitt et al. | 257/48 |
| 5,334,875 | 8/1994 | Sugano et al. | 257/686 |
| 5,434,745 | 7/1995 | Shokrgozar et al. | 257/686 |

FOREIGN PATENT DOCUMENTS

| | | | |
|---|---|---|---|
| 60-194548 | 10/1985 | Japan | 257/686 |
| 4-267361 | 9/1992 | Japan | 257/777 |

*Primary Examiner*—Mahshid D. Saadat
*Assistant Examiner*—T. M. Arroyo
*Attorney, Agent, or Firm*—Banner & Witcoff, Ltd.

[57] ABSTRACT

A semiconductor device for reducing the mounting area of semiconductor chips on the mounting substrate includes a first base substrate made of an insulating material, a semiconductor chip mounted on the first base substrate, a plurality of internal wiring elements disposed on the first base substrate, and a plurality of bonding elements respectively connecting the semiconductor chip and the internal wiring elements. A second base substrate made of an insulating material is disposed on the first base substrate, and a resin seals the semiconductor chip and the bonding elements. A plurality of lower electrodes are formed on a lower surface of the first base substrate, a plurality upper electrodes are formed on an upper surface of the second base substrates, and a plurality of through holes respectively connecting one of the lower electrodes to one of the upper electrodes are formed on an external side surface of the first and second base substrate.

16 Claims, 4 Drawing Sheets

STACKED SEMICONDUCTOR DEVICE HAVING PERIPHERAL THROUGH HOLES

BACKGROUND OF THE INVENTION

1. Field of the Invention

The present invention relates to a semiconductor device requiring high density, and in particular, to a semiconductor device for use in a memory chip which can be mounted in large numbers on a mounting substrate.

2. Description of the Related Art

Figure 5A:
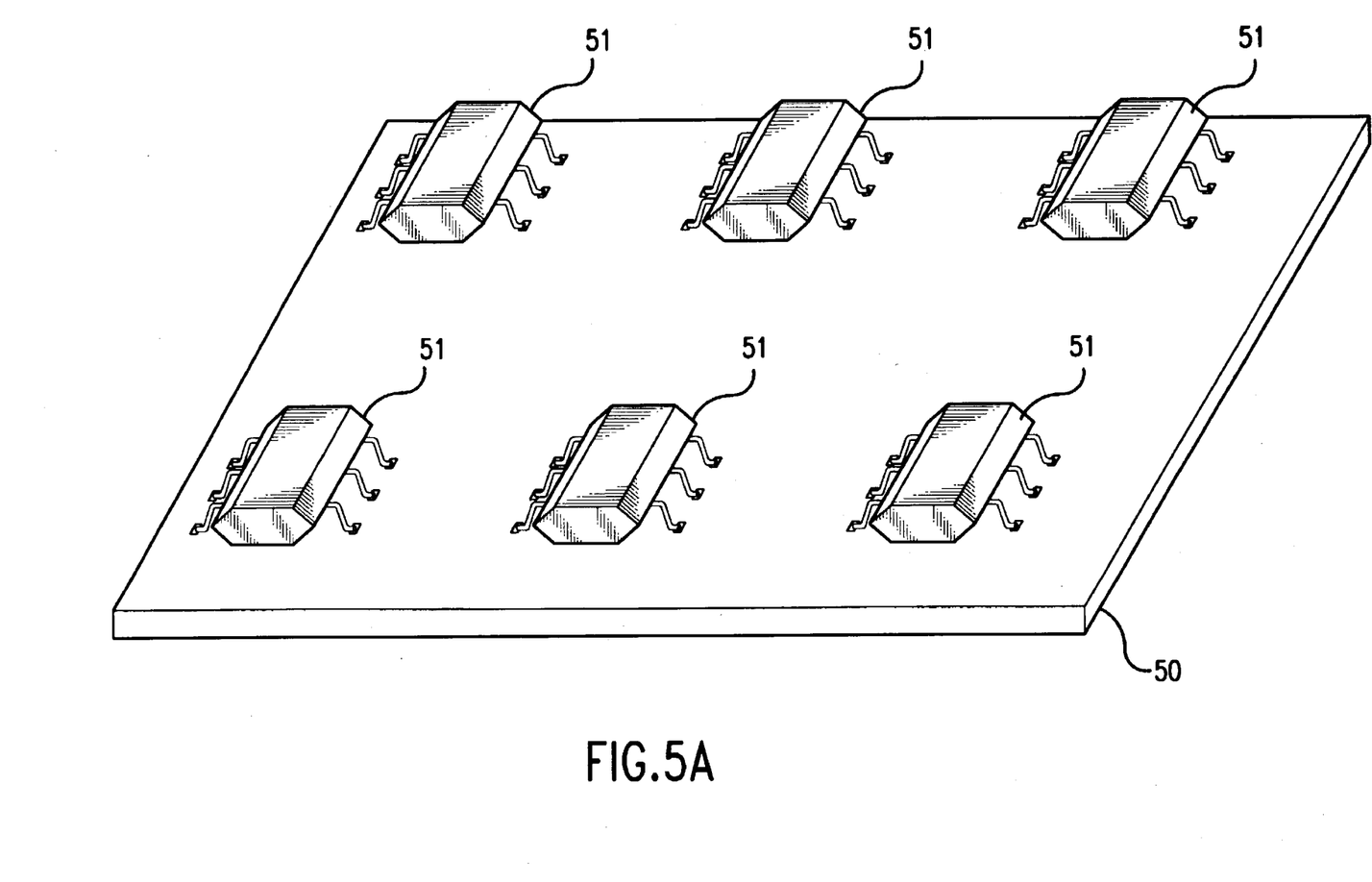
FIG. 5A is a schematic view showing a conventional arrangement of semiconductor chips on a mounting substrate.
Figure 5B:
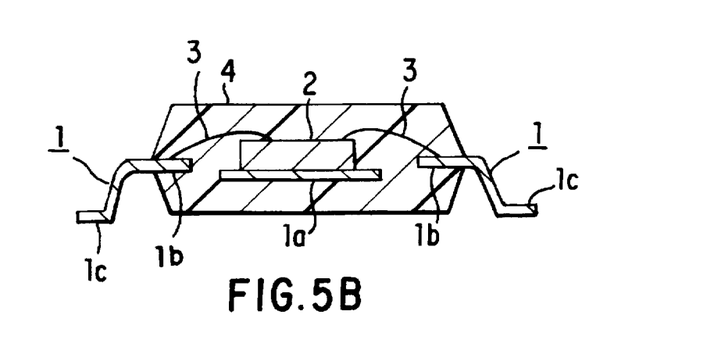
FIG. 5B is a sectional view showing a conventional semiconductor device.

FIG. 5A is a schematic view showing the layout of semiconductor device 51 on a mounting substrate 50 in conventional art. FIG. 5B is a sectional view showing a conventional semiconductor device. As shown in FIG. 5B, a lead frame 1 includes a bed 1a, a plurality of internal leads 1b and external leads 1c.

A semiconductor chip 2 is mounted on the bed 1a and electrically connected to the internal leads 1b by a plurality of bonding wires 3. The internal leads 1b, bed 1a, semiconductor chip 2 and bonding wires 3 are sealed by a resin 4. The external leads 1c are respectively connected to one of a plurality of electrode pad on a mounting substrate (not shown), completing the mounting of the semiconductor device on the mounting substrate.

As shown in FIG. 5B, a plurality of semiconductor devices are positioned on the mounting substrate 50 on the same level. Therefore, a large surface area is needed to accommodate many semiconductor devices on one mounting board.

SUMMARY OF THE INVENTION

To mount a plurality of such conventional semiconductor devices on a mounting substrate, it is impossible to position them in a direction perpendicular to a mounting surface. In order to mount more semiconductor chips on the substrate, semiconductor devices are arranged side by side in a direction parallel to the mounting surface of the mounting substrate. This requires a larger mounting area, making it impossible to mount semiconductor chips in a higher density on the mounting substrate.

In view of the foregoing, it is an object of the present invention to provide a semiconductor device having a smaller mounting area of semiconductor chips on the mounting surface.

In order to solve the above-mentioned problems, a first embodiment of the present invention includes a first semiconductor device having a first base substrate made of glass epoxy resin, a first semiconductor chip mounted on the first base substrate, a first through hole formed in the first base substrate, and a first external electrode formed on an outer surface of the first base substrate, wherein the first external electrode is electrically connected to the first semiconductor chip through the first through hole; a second semiconductor device having a second base substrate made of glass epoxy resin, a second semiconductor chip mounted on the second base substrate, a second through hole formed in the second base substrate, and a second external electrode formed on the outer surface of the second base substrate, wherein the second external electrode is electrically connected to the second semiconductor chip through the second through hole; and a mounting substrate made of glass epoxy resin on which the first and second semiconductor devices are mounted and aligned in a perpendicular direction. The first and second semiconductor devices are electrically connected to each other by the first and second external electrodes.

A second embodiment of the present invention includes a base substrate having a first surface, a second surface joined to the first surface and a third surface joined to the first surface. A semiconductor chip is mounted on the base substrate. The second embodiment further includes first connecting means provided on the first surface and electrically insulated from the semiconductor chip; and second connecting means provided on the first surface and electrically connected to the semiconductor chip. This embodiment also includes a first external electrode provided on the second surface, aligned with the first connecting means and connected to the first connecting means; a second external electrode provided on the second surface, aligned with the second connecting means and connected to the second connecting means; a third external electrode provided on the third surface, aligned with the first connecting means; a fourth external electrode provided on the third surface, aligned with the second connecting means and connected to the second connecting means; and a test pad provided on the third surface, aligned with the third external electrode, insulated from the third external electrode and electrically connected to the fourth external electrode.

A third embodiment of the present invention includes a first base substrate having a first surface, a second surface joined to the first surface and a third surface joined to the first surface on which a first semiconductor chip is mounted. This embodiment further includes a first electrode pad provided on the first semiconductor chip; first connecting means electrically connected to the first electrode pad and provided on the first surface; and second connecting means electrically insulated from the first electrode pad and provided on the first surface. This embodiment also includes a first external electrode provided on the second surface, aligned with the first connecting means and connected to the first connecting means; a first test pad connected to the first external electrode and provided on the second surface; a second external electrode provided on the second surface, aligned with the second connecting means and connected to the second connecting means; a third external electrode provided on the third surface, aligned with the first connecting means and connected to the first connecting means; a fourth external electrode provided on the third surface, aligned with the second connecting means and connected to the second connecting means. Additionally, this embodiment of the present invention includes a second base substrate having a fourth surface, a fifth surface joined to fourth surface and a sixth surface joined to the fourth surface; a second semiconductor chip mounted on the second base substrate; a second electrode pad provided on the second semiconductor chip and aligned with the first electrode pad; third connecting means electrically insulated from the second electrode pad and provided on the fourth surface; a fifth external electrode provided on the fifth surface aligned with the third connecting means and electrically connected to the third connecting means and the third external electrode; a second test pad electrically insulated from the fifth external electrode, provided on the fifth surface and aligned with the first test pad; a sixth external electrode electrically connected to the second test pad, provided on the fifth surface, aligned with the fourth connecting means and electrically connected to the fourth connecting means and the fourth external electrode; a seventh external electrode provided on the sixth surface, aligned with the third connecting means and connected to the third connecting means; and an eighth external electrode provided on the sixth surface, aligned with the fourth connecting means and connected to the fourth connecting means.

In this invention, the mounting substrate, first and second base substrates are made of the same material, e.g., glass epoxy resin, such that the substrates can have an equal thermal expansion coefficient. Any thermal stress caused by temperature changes and applied to the semiconductor devices mounted on the mounting substrate is small. This prevents the separation of the first and second semiconductor devices from the mounting substrate.

BRIEF DESCRIPTION OF THE DRAWINGS

The accompanying drawings which are incorporated in and constitute a part of the specification are as follows.

DETAILED DESCRIPTION OF THE PREFERRED EMBODIMENTS

The present invention will now be explained in detail with reference to the accompanying drawings.

Figure 1:
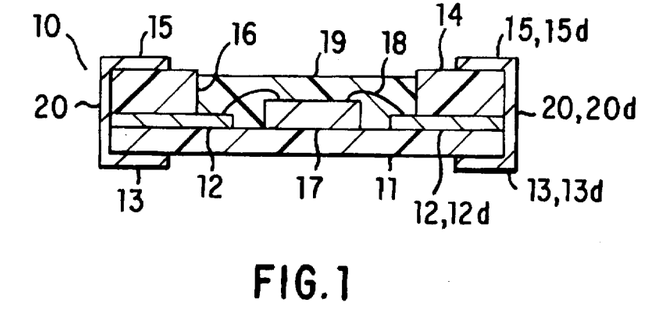
FIG. 1 is a sectional view showing the first semiconductor device according to a first embodiment of the present invention including a first semiconductor chip mounted on a base substrate.
Figure 2A:
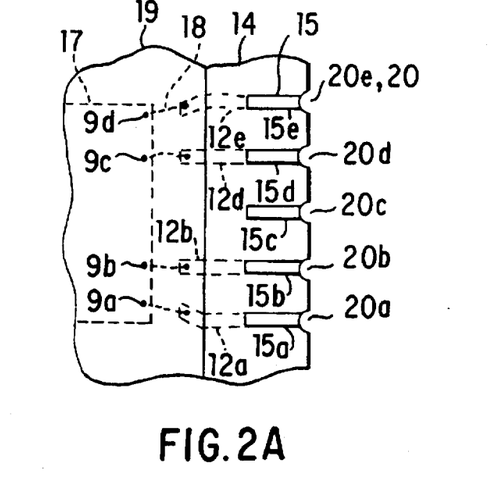
FIG. 2(a) is a plan view showing part of the upper surface of the first embodiment illustrated by FIG. 1.
Figure 2B:
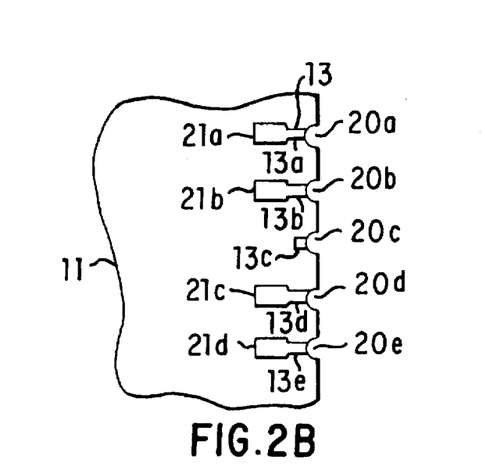
FIG. 2(b) is a plan view showing part of the lower surface of the first embodiment illustrated by FIG. 1.

FIG. 1 is a sectional view showing a first semiconductor device according to the embodiment of the present invention. FIG. 2(a) is a plan view showing the upper surface of the first semiconductor device illustrated by FIG. 1. FIG. 2(b) is a plan view showing part of the lower surface of the first semiconductor device illustrated by FIG. 1.

As shown in FIG. 1, the upper surface of the first base substrate 11 made of glass epoxy resin is provided with a plurality of internal wiring elements 12 made of, for example, copper or other conductive material. The lower surface of the first base substrate 11 is provided with a plurality of lower electrodes (external electrode) 13 made of, for example, copper or other conductive material. On the first base substrate 11 and the internal wiring element 12, there is a second base substrate 14 made of glass epoxy resin. A plurality of upper electrodes (external electrodes) 15 made of, for example, copper are provided on the upper surface of the second base substrate 14 whose central portion is provided with cavity 16. The second base substrate 14 attached to the first base substrate 11 by using an adhesive agent.

A first semiconductor chip 17 is mounted in the cavity 16 and is electrically connected to the internal wiring elements 12 by a plurality of bonding wires 18. The inside of the cavity 16 is sealed by a resin 19. That is, inside the cavity, the first semiconductor chip 17 and the bonding wires 18 are sealed by the resin 19. The upper surface of the resin 19 is formed to be lower than that of the upper electrodes 15 to enable a second semiconductor device to be positioned on top of the first semiconductor device as described below with reference to FIG. 3. The upper electrodes 15 are electrically connected to the lower electrodes 13 by semi-circularly cut through holes made of copper or aluminum (which are referred to as 'through holes' hereinafter copper or aluminum). The internal wiring elements 12 are electrically connected to the through holes 20.

As shown in FIGS. 2(a) and (b), the first upper electrode 15a is formed on the upper surface of the first semiconductor device 10 and aligned with first through hole (first connecting means) 20a. The first lower electrode 13a is formed on the lower surface of the first semiconductor device 10 and aligned with the first through hole 20a. The first upper electrode 15a is electrically connected to the first internal wiring element 12a and the first lower electrode 13a by the first through hole 20a. The first internal wiring element 12a is electrically connected to the first electrode pad 9a formed on the first semiconductor chip 17 by bonding wire 18. The first lower electrode 13a is connected to the first test pad 21a and is aligned with the first lower electrode 13a.

A second upper electrode 15b is formed on the upper surface of the first semiconductor device 10 and aligned with a through hole (second connecting means) 20b. A second lower electrode 13b is formed on the lower surface of the first semiconductor device 10 aligned with a second through hole 20b. The second upper electrode 15b is electrically connected to a second internal wiring element 12b and the second lower electrode 13b by the second through hole 20b. The second internal wiring element 12b is electrically connected to a second electrode pad 9b formed on the first semiconductor chip 17 by a bonding wire 18. A second lower electrode 13b is connected to a second test pad 21b, which is aligned with the second lower electrode 13b.

A third upper electrode 15c is formed on the upper surface of the first semiconductor device 10 and aligned with third through hole (third connecting means) 20c. The third lower electrode 13c is formed on the lower surface of the first semiconductor device 10 and aligned with the third through hole 20c. The third upper electrode 15c is connected to the third lower electrode 13c by the third through hole 20c. The third through hole 20c is electrically insulated from the second electrode pad 9b. The third lower electrode 13c is electrically insulated from the second test pad 21b.

A fourth upper electrode 15d is formed on the upper surface of the first semiconductor device 10 and aligned with a fourth through hole (fourth connecting means) 20d. A fourth lower electrode 13d is formed on the lower surface of the first semiconductor device 10 and aligned with the fourth through hole 20d. The fourth upper electrode 15d is electrically connected to a fourth internal wiring element 12d and the fourth lower electrode 13d, respectively, by the fourth through hole 20d. The fourth internal wiring element 12d is electrically connected to a third electrode pad 9c formed on the first semiconductor chip 10 by the bonding wire 18. The fourth lower electrode 13d is connected to a third test pad 21c, which is aligned with the fourth lower electrode 13d.

A fifth upper electrode 15e is formed on the upper surface of the first semiconductor device 10 and aligned with a fifth through hole (fifth connecting means) 20e. A fifth lower electrode 13e is formed on the lower surface of the first semiconductor device 10 and aligned with the fifth through hole 20e. The fifth upper electrode 15e is electrically connected to a fifth internal wiring element 12e and the fifth lower electrode 13e by the fifth through hole 20e. The fifth internal wiring element 12e is electrically connected to a fourth electrode pad 9d, which is formed on the first semiconductor chip 17, by the bonding wire 18. The fifth lower electrode 13e is connected to the fourth test pad 21d, which is aligned with the fifth lower electrode 13e.

Figure 3:
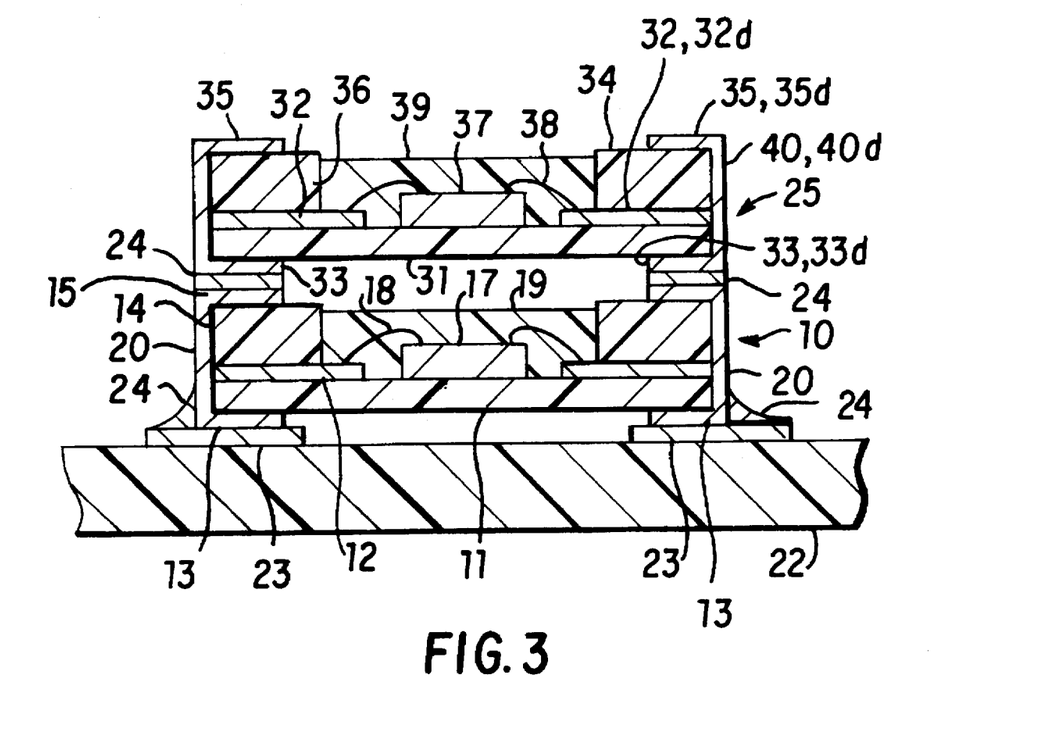
FIG. 3 is a sectional view showing a second embodiment of the present invention including a first and second semiconductor chip mounted on respective base substrates, one on top of the other.
Figure 4A:
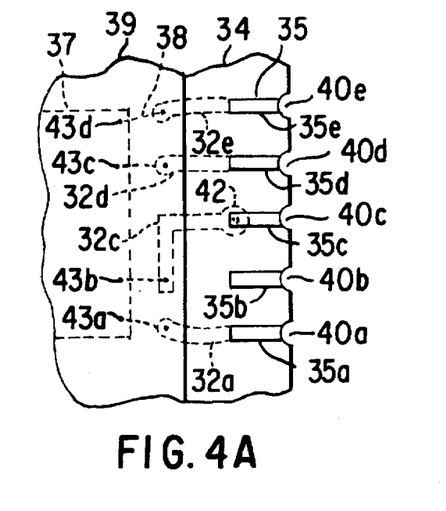
FIG. 4(a) is a plan view showing part of the upper surface of the second semiconductor device according to the embodiment of the present invention illustrated by FIG. 3.
Figure 4B:
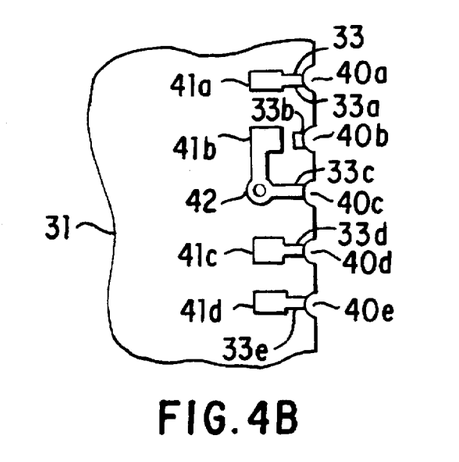
FIG. 4(b) is a plan view showing part of the lower surface of the second semiconductor device according to the embodiment of the present invention illustrated by FIG. 3.

FIG. 3 is a sectional view showing the mounting of two semiconductor devices on the mounting substrate according to the second embodiment of the present invention. FIG. 4(a) is a plan view showing part of the upper surface of the second semiconductor device illustrated by FIG. 3. FIG. 4(b) is a plan view showing part of the lower surface of the second semiconductor device illustrated by FIG. 3.

As shown in FIG. 3, the first semiconductor device 10 illustrated by FIG. 1 is mounted on a mounting substrate 22 made of glass epoxy resin. A plurality of electrodes 23 are provided on the surface of the mounting substrate 22 and connected to a lower electrode (external electrode) 13 of the first semiconductor device 10 by solder 24.

A second semiconductor device 25 is mounted on the first semiconductor device 10. The upper electrode (external electrode) 15 of the first semiconductor device 10 is connected to lower electrode 33 of the second semiconductor device 25 by the solder 24.

The structure of the second semiconductor device 25 will now be described.

The upper surface of the first base substrate 31 made of glass epoxy resin is provided with a plurality of internal wiring elements 32 made of, for example, copper. The lower surface of the first base substrate 31 is provided with a plurality of lower electrodes (external electrodes) 33 made of, for example, copper or other conductive material. On the first base substrate 31 and the internal wiring elements 32, there is second base substrate 34 made of glass epoxy resin. A plurality of electrodes (external electrodes) 35 made of, for example, copper or other conductive material are provided on the upper surface of the second base substrate 34 whose central portion is provided with a cavity 36. The second base substrate 34 is attached to the first base substrate 31 by using an adhesive agent.

A second semiconductor chip 37 is mounted in the cavity 36 and electrically connected to the internal wiring elements 32 by a plurality of bonding wires 38. The inside of the cavity 36 is sealed by a resin 39. That is, inside the cavity 36, the second semiconductor chip 37 and the bonding wires 38 are sealed by the resin 39. The upper surface of the resin 39 is formed to be lower than that of the upper electrodes 35 to enable a second semiconductor device to be positioned on top of the first semiconductor device. The upper electrodes 35 are electrically connected to lower electrodes 33 by semicircularly cut through holes (which are referred to as 'through holes' hereinafter) 40 made of copper or aluminum. The internal wiring elements 32 are electrically connected to the through holes 40.

As shown in FIGS. 4(a) and (b), the first upper electrodes 35a are formed on the upper surface of the second semiconductor device 25 and aligned with first through hole (first connecting means) 40a. The first lower electrode 33a is formed on the lower surface of the second semiconductor device 25 and aligned with the first through hole 40a. The first upper electrode 35a is electrically connected to the first internal wiring element 32a and the first lower electrode 33a by the first through hole 40a. The first internal wiring element 32a is electrically connected to the first electrode pad 43a formed on the second semiconductor chip 37 by one of bonding wires 38. The first electrode pad 43a corresponds to the first electrode pad 9a of the first semiconductor device 10. The first lower electrode 33a is connected to a first test pad 41a, which is aligned with the first lower electrode 33a.

A second upper electrode 35b is formed on the upper surface of the second semiconductor device 25 and aligned with a second through hole (second connecting means) 40b. A second lower electrode 33b is formed on the lower surface of the second semiconductor device 25 and aligned with the second through hole 40b. The second upper electrode 35b is connected to the second lower electrode 33b by the second through hole 40b. The second through hole 40b is electrically insulated from a second electrode pad 43b formed on the second semiconductor chip 37. The second electrode pad 43b corresponds to the second electrode pad 9b of the first semiconductor device 10. The second lower electrode 33b is electrically insulated from second test pad 41b, which is aligned with the second lower electrode 33b.

Third upper electrode 35c is formed on the upper surface of the second semiconductor device 25 and aligned with third through hole (third connecting means) 40c. The third lower electrode 33c is formed on the lower surface of the second semiconductor device 25 and aligned with the third through hole 40c. The third upper electrode 35c is electrically connected to the third internal wiring element 32c and the third lower electrode 33c respectively by the third through hole 40c. The tip portion of the third internal wiring element 32c is turned toward the first internal wiring element 32a as shown in FIG. 4(a). It is formed in a position corresponding to the tip portion of the second internal wiring element 12b of the first semiconductor device 10. The third internal wiring element 32c is electrically connected to the second electrode pad 43b by one of the bonding wires 38. The third internal wiring element 32c is electrically connected to the third lower electrode 33c by through hole (which is an ordinary through hole instead of a semicircular structure) 42 made of copper or aluminum. The third lower electrode 33c is connected to the second test pad 41b.

Fourth upper electrode 35d is formed on the upper surface of the second semiconductor device 25 and aligned with fourth through hole (fourth connecting means) 40d. Fourth lower electrode 33d is formed on the lower surface of the second semiconductor device 25 and aligned with the fourth through hole 40d. The fourth upper electrode 35d is electrically connected to a fourth internal wiring element 32d and the fourth lower electrode 33d, respectively, by the fourth through hole 40d. The fourth internal wiring element 32d is electrically connected to a third electrode pad 43c formed on the second semiconductor chip 25, by one of the bonding wires 38. The third electrode pad 43c corresponds to the third electrode pad 9c of the first semiconductor device 10. The fourth lower electrode 33d is connected to a third test pad 41c, which is aligned with the fourth lower electrode 33d.

A fifth upper electrode 35e is formed on the upper surface of the second semiconductor device 25 and aligned with the fifth through hole (fifth connecting means) 40e. A fifth lower electrode 33e is formed on the lower surface of the second semiconductor device 25 and aligned with the fifth through hole 40e. The fifth upper electrode 35e is electrically connected to fifth internal wiring element 32e and the fifth lower electrode 33e by the fifth through hole 40e. The fifth internal wiring element 32e is electrically connected to a fourth electrode pad 43d which is formed on the second semiconductor chip 37, by one of the bonding wires 38. The fourth electrode pad 43d corresponds to the fourth electrode pad 9d of the first semiconductor device 10. The fifth lower electrode 33e is connected to the fourth test pad 41d, which is aligned with the fifth lower electrode 33e.

When the semiconductor devices 10 and 25 are mounted on the mounting substrate 22 as shown in FIG. 3, the upper electrodes 15a to 15e of the first semiconductor device 10 are electrically connected to the lower electrodes 33a to 33e of the second semiconductor device 25 via solder 24.

Specifically, the first upper electrode 15a is electrically connected to the first lower electrode 33a, and the second upper electrode 15b is electrically connected to the second lower electrode 33b. The third upper electrode 15c is electrically connected to the third lower electrode 33c, and the fourth upper electrode 15d is electrically connected to the fourth lower electrode 33d. The fifth upper electrode 15e is electrically connected to the fifth lower electrode 33e.

Also, in case of mounting the semiconductor devices on the substrate as shown in FIG. 3, the electrode pads 9a to 9d and 43a to 43d of the first and second semiconductor chips 17 and 37, and the lower electrodes 13a to 13e of the first semiconductor device are connected as follows.

The first electrode pad 9a of the first semiconductor chip 17 and the first electrode pad 43a of the second semiconductor chip 37 are electrically connected to the first lower electrode 13a. The second electrode pad 9b of the first semiconductor chip 17 is electrically connected to the second lower electrode 13b. The second electrode pad 43b of the second semiconductor chip 37 is electrically connected to the third lower electrode 13c. The third electrode pad 9c of the semiconductor chip 17 and the third electrode pad 43c of the second semiconductor chip 37 are electrically connected to the fourth lower electrode 13d. The fourth electrode pad 9d of the first semiconductor chip 17 and the fourth electrode pad 43d of the second semiconductor chip 37 are electrically connected to the fifth lower electrode 13e.

According to the above-mentioned embodiment, as FIG. 4(a) illustrates, the second through hole 40b is electrically insulated from the second electrode pad 43b. The third through hole 40c is electrically connected, via the third internal wiring element 32d, to the second electrode pad 43b. As FIG. 4(b) illustrates, the second lower electrode 33b which is connected to the second through hole 40b, and the second test pad 41b are electrically insulated from each other. The third lower electrode 33c which is connected to the third through hole 40c, and the second test pad 41b are connected to each other. Such a connection allows the first to fourth test pads 41a to 41d of the second semiconductor device 25 to be formed in the same position as the first to fourth test pads 21a to 21d of the first semiconductor device 10. As a result, the first and second semiconductor devices 10 and 25 can be tested without specifically changing connecting terminals for connecting test pads used to test the device concerned. Thus, manufacturing costs of semiconductor devices can be reduced. In addition, such a connection can increase the degree of freedom of wiring. Therefore, the first and second semiconductor devices 10 and 25 can be mounted on the mounting substrate 22 while piling them up in a perpendicular direction. The mounting area of the semiconductor chips on the mounting substrate 22 can be made small, allowing for a higher mounting density.

Since such a connection system as illustrated by FIGS. 2(a), (b) and FIGS. 4(a) and (b) are adopted, the first electrode pad 9a of the first semiconductor chip 17 and the first electrode pad 43a of the second semiconductor chip 37 can be electrically connected to the first lower electrode 13a.

Moreover, the second electrode pad 9b of the first semiconductor chip 17 can be electrically connected to the second lower electrode 13b via the second internal wiring element 12b and the second through hole 20b. Also, the second electrode pad 43b of the second semiconductor chip 37 can be electrically connected to the third internal wiring element 32c, the third through hole 40c, the third lower electrode 33c and the third through hole 20c. The electrode pads 9a, 9c, 9d, 43a, 43c and 43d which can be interchangeably used between the first and second semiconductor chips 17 and 37, are electrically connected to the same lower electrodes 13a, 13d and 13e. The electrode pads 9b and 43b which require electrical separation and are not interchangeable are electrically connected to the different lower electrodes 13b and 13c. Consequently, a plurality of semiconductor devices can be mounted on a mounting substrate in a perpendicular direction and the mounting area can be thereby reduced to a large extent, compared with the conventional ones.

Also, since the mounting substrate 22 and the first and second base substrates 11, 31, 14 and 34 are made of the same material, i.e., glass epoxy resin, these substrates can have an equal thermal expansion coefficient. Therefore, thermal stress caused by temperature changes and applied to the semiconductor devices mounted on the mounting substrate 22 is small. As a result, separation of the first and second semiconductor devices 10 and 25 from the mounting substrate 22 is prevented.

Moreover, the glass epoxy resin or a bonding agent between the resin 19 of the first semiconductor device 10 and the lower surface of the first base surface 31 of the second semiconductor device 25 prevents vibration of the semiconductor devices.

Also, since the glass epoxy resin is used as the substrate material for both the first and second base substrates 11, 31, 14 and 34, and the through holes 20 and 40 are used as connecting means, manufacturing costs of semiconductor devices are reduced and productivity improved.

Notably, although the above embodiment describes the use of glass epoxy resin as the material for the first and second base substrates 11 and 14, ceramic materials may be also used. The use of ceramic materials for the first and second base substrates 11 and 14 may improve the reliability of the device.

Moreover, although the upper electrode 15 and the lower electrode 13 are connected to the semicircularly cut through hole, they may also be connected to something other than that, e.g., solder or other suitable material.

Although the present invention is shown with two semiconductor devices in FIG. 3, various numbers of stacked semiconductor devices are considered to be within the scope of this invention.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor device comprising:
  a first semiconductor device including a first base substrate having side surfaces and made of glass epoxy resin, a second base substrate made of glass epoxy resin attached to the first base substrate, a central portion of said second base substrate being provided with a first cavity having side surfaces, a first semiconductor chip mounted in the first cavity and on the first base substrate, a first bonding wire connected to the first semiconductor chip, a first internal wiring element connected to the first bonding wire, a first resin covering the first cavity, a first through hole connected to the first internal wiring element and formed on one of the side surfaces of the first base substrate and one of the side surfaces of the second base substrate, a first lower external electrode formed on a lower surface of the first base substrate, a first upper external electrode formed on an upper surface of the second base substrate, and a first test pad formed on the lower surface of the first base substrate, wherein said first lower external electrode and said first upper external electrode are connected to the first through hole, said first test pad and said first lower electrode are connected, and a top surface of the first resin is lower than said upper surface of the second base substrate;

a second semiconductor device including a third base substrate having side surfaces made of glass epoxy resin, a fourth base substrate made of glass epoxy resin attached to the third base substrate, a central portion of said fourth base substrate having a second cavity with side surfaces, a second semiconductor chip mounted in the second cavity and on the third base substrate, a second bonding wire connected to the second semiconductor chip, a second internal wiring element connected to the second bonding wire, a second resin covering the second cavity, a second through hole connected to the second internal wiring element and formed on one of the side surfaces of the third base substrate and one of the side surfaces of the fourth base substrate, a second lower external electrode formed on the lower surface of the third base substrate, a second upper external electrode formed on an upper surface of the fourth base substrate, and a second test pad formed on the lower surface of the third base substrate which is at the same location as the first test pad of the first semiconductor device, wherein said second lower external electrode and said second upper external electrode are connected to the second through hole, said second test pad and said second lower external electrode are electrically insulated and a top surface of the second resin is lower than said upper surface of the fourth base substrate; and a mounting substrate made of glass epoxy resin on which the first and second semiconductor devices are mounted and aligned in a perpendicular direction, the first and second semiconductor devices electrically connected to each other by the first upper external electrode and the second lower external electrode.

2. A semiconductor device comprising:

a first base substrate having a first surface, a second surface joined to the first surface and a third surface joined to the first surface;

a first semiconductor chip mounted on the first surface of the first base substrate;

a first electrode pad provided on the first semiconductor chip;

first connecting means electrically connected to the first electrode pad and provided on the first surface;

second connecting means electrically insulated from the first electrode pad and provided on the first surface;

a first external electrode provided on the second surface, aligned with the first connecting means and connected to the first connecting means;

a first test pad connected to the first external electrode and provided on the second surface;

a second external electrode provided on the second surface, aligned with the second connecting means and connected to the second connecting means;

a third external electrode provided on the third surface, aligned with the first connecting means and connected to the first connecting means;

a fourth external electrode provided on the third surface, aligned with the second connecting means and connected to the second connecting means;

a second base substrate having a fourth surface, a fifth surface joined to the fourth surface and a sixth surface joined to the fourth surface;

a second semiconductor chip mounted on the second base substrate;

a second electrode pad provided on the second semiconductor chip and aligned with the first electrode pad;

third connecting means electrically insulated from the second electrode pad and provided on the fourth surface;

fourth connecting means electrically connected to the second electrode pad and provided on the fourth surface;

a fifth external electrode provided on the fifth surface, aligned with the third connecting means and electrically connected to the third connecting means and the third external electrode;

a second test pad electrically insulated from the fifth external electrode, provided on the fifth surface and aligned with the first test pad;

a sixth external electrode electrically connected to the second test pad, provided on the fifth surface, aligned with the fourth connecting means and electrically connected to the fourth connecting means and the fourth external electrode;

a seventh external electrode provided on the sixth surface, aligned with the third connecting means and connected to the third connecting means; and an eighth external electrode provided on the sixth surface, aligned with the four connecting means and connected to the fourth connecting means.

3. A semiconductor device according to claim 2, wherein the first to fourth connecting means are through holes.

4. A semiconductor device according to claim 3, wherein the first and second base substrates are formed of glass epoxy resin.

5. A semiconductor device according to claim 4, further comprising a mounting substrate made of glass epoxy resin on which the semiconductor devices are mounted.

6. A semiconductor device comprising:

a first base substrate made of an insulating material;

a semiconductor chip mounted on the first base substrate;

a plurality of internal wiring elements disposed on the first base substrate;

a plurality of bonding elements respectively connecting the semiconductor chip and the internal wiring elements;

a second base substrate made of an insulating material disposed on the first base substrate;

a resin sealing the semiconductor chip and the bonding elements;

a plurality of lower electrodes formed on a lower surface of the first base substrate;

a plurality of upper electrodes formed on an upper surface of the second base substrate;

a plurality of through holes respectively connecting one of the lower electrodes to one of the upper electrodes, each said through hole formed on an external side surface of the first and second base substrate; and a plurality of test pads formed on the lower surface of the first base substrate;

wherein all but one of said plurality of lower electrodes is respectively connected to said internal wiring elements.

7. A semiconductor device according to claim 6, wherein the first base substrate and the second base substrate are made of glass epoxy resin.

8. A semiconductor device according to claim 6, further comprising a mounting substrate made of glass epoxy resin on which the semiconductor device is mounted.

9. A semiconductor device according to claim 6, wherein the number of internal wiring elements is less that the number of lower electrodes.

10. A semiconductor device according to claim 9, wherein the number of said test pads is less that the number of said lower electrodes.

11. A semiconductor device according to claim 10, wherein one of said lower electrodes is not connected to any of said test pads.

12. A semiconductor device according to claim 11, wherein all but one of said lower electrodes are respectively connected to said test pads.

13. A semiconductor device comprising:

a first base substrate having side surfaces made of glass epoxy resin;

a second base substrate made of glass epoxy resin attached to the first base substrate, a central portion of said second base substrate being provided with a cavity having side surfaces;

a semiconductor chip mounted in the cavity of the second base substrate and on the first base substrate;

a bonding wire connected to the first semiconductor chip;

an internal wiring element connected to the bonding wire;

a resin covering the cavity;

a first through hole connected to the internal wiring element and formed on one of the side surfaces of the first base substrate and one of the side surfaces of the second base substrate;

a second through hole disconnected from the internal wiring element and formed on one of the side surfaces of the second base substrate in parallel to said first through hole;

a first lower external electrode formed on a lower surface of the first base substrate;

a second lower external electrode formed on the lower surface of the first base substrate in parallel to the first base substrate;

an first upper external electrode formed on an upper surface of the second base substrate;

a second upper external electrode formed on the upper surface of the second base substrate in parallel to said first upper external electrode;

a first test pad provided on the lower surface of the first base substrate and connected to the first lower external electrode, and a second test pad provided on the lower surface of the first base substrate in parallel with said first test pad and disconnected from said second lower external electrode;

wherein said first lower external electrode and said first upper external electrode are connected to the first through hole, said second lower external electrode and said second upper external electrode are connected to the second through hole, and said top surface of the resin is lower than said upper surface of the second base substrate.

14. A semiconductor device according to claim 13, further comprising a mounting substrate made of glass epoxy resin on which semiconductor devices are mounted using solder.

15. A semiconductor device according to claim 13, wherein said through hole has a semicircular shape.

16. A semiconductor device according to claim 1, wherein said first and second through holes have a semicircular shape.

* * * * *